(12) United States Patent
Mcavoy

(10) Patent No.: US 12,729,111 B2
(45) Date of Patent: Sep. 8, 2026

(54) MEMS DEVICE WITH INTEGRATED CMOS CIRCUIT

(71) Applicant: 3C PROJECT MANAGEMENT LIMITED, Greystones County (IE)

(72) Inventor: Gregory John Mcavoy, Greystones County (IE)

(73) Assignee: 3C PROJECT MANAGEMENT LIMITED, Greystones (IE)

( * ) Notice: Subject to any disclaimer, the term of this patent is extended or adjusted under 35 U.S.C. 154(b) by 693 days.

(21) Appl. No.: 18/023,904

(22) PCT Filed: Sep. 1, 2021

(86) PCT No.: PCT/EP2021/074187
§ 371 (c)(1),
(2) Date: Feb. 28, 2023

(87) PCT Pub. No.: WO2022/049159
PCT Pub. Date: Mar. 10, 2022

(65) Prior Publication Data

US 2023/0312337 A1 Oct. 5, 2023

(30) Foreign Application Priority Data

Sep. 1, 2020 (GB) ...................................... 2013718
Oct. 30, 2020 (EP) ..................................... 20205033

(51) Int. Cl.
*B41J 2/045* (2006.01)
*B41J 2/14* (2006.01)
(Continued)

(52) U.S. Cl.
CPC ....... *B81C 1/00246* (2013.01); *B41J 2/04581* (2013.01); *B41J 2/14* (2013.01);
(Continued)

(58) Field of Classification Search
CPC . B41J 2/04581; B41J 2/005; B41J 2/14; B41J 2/16; B41J 2/14233; B41J 2/161;
(Continued)

(56) References Cited

U.S. PATENT DOCUMENTS 4,291,293 A 9/1981 Yamada et al.
4,295,115 A 10/1981 Takahashi et al.
(Continued)

FOREIGN PATENT DOCUMENTS

CN 105399043 3/2016
CN 108117038 6/2018
(Continued)

OTHER PUBLICATIONS

Notice on the First Office Action dated May 7, 2025 issued for Chinese Application No. 202180053261.8 (11 pages).
(Continued)

*Primary Examiner* — Anh T Vo
(74) *Attorney, Agent, or Firm* — Nixon & Vanderhye P.C.

(57) ABSTRACT

A method of manufacturing a MEMS device, the MEMS device comprising a movable Micro-Electro-Mechanical piezoelectric component and a CMOS circuit configured to be in conductive communication with the Micro-Electro-Mechanical component. A plurality of CMOS circuit layers are formed on a substrate to form the CMOS circuit, the plurality of CMOS circuit layers comprising a plurality of CMOS passivation and metallisation layers. A portion of at least one of the plurality of CMOS passivation and metallisation layers is removed in a component region of the device. One or more component region layers are formed in place of the removed portion in the component region to form the movable Micro-Electro-Mechanical piezoelectric component. The one or more component region layers are
(Continued)

different from the portion of the at least one of the plurality of CMOS passivation and metallisation layers.

21 Claims, 8 Drawing Sheets

(51) Int. Cl.
*B81B 7/02* (2006.01)
*B81C 1/00* (2006.01)
*H10N 30/20* (2023.01)

(52) U.S. Cl.
CPC ............... *B81B 7/02* (2013.01); *H10N 30/20* (2023.02); *B81B 2201/03* (2013.01); *B81B 2203/0118* (2013.01); *B81B 2203/0127* (2013.01); *B81B 2207/015* (2013.01); *B81C 2201/0132* (2013.01); *B81C 2201/016* (2013.01)

(58) Field of Classification Search
CPC ...... B41J 2/1628; B41J 2/1632; B41J 2/1642; B41J 3/00; B41J 2002/1437; B41J 2002/14491; B41J 2202/13; B41J 2202/15; B41J 2202/18; B81B 7/007; B81B 7/02; B81B 2201/03; B81B 2203/018; B81B 2203/0127; B81C 1/00246; B81C 1/00253; B81C 2201/0132; B81C 2201/016; H10N 30/071; H10N 30/20; H10N 39/00; H01L 21/3212; H01L 41/04; H01L 41/08; H01L 41/09
See application file for complete search history.

(56) References Cited

U.S. PATENT DOCUMENTS 5,870,121 A 2/1999 Chan
5,917,645 A 6/1999 Min et al.
6,788,170 B1 9/2004 Kaitila et al.
9,276,080 B2 * 3/2016 Sridharamurthy .... B81B 3/0086
9,546,090 B1 * 1/2017 Xia .................... B81C 1/00253
2003/0117041 A1 6/2003 Kurihara et al.
2004/0145276 A1 7/2004 Cramer et al.
2007/0247025 A1 10/2007 Sciortino et al.
2007/0281381 A1 * 12/2007 Ayazi .................. B81C 1/00285 438/52
2008/0068424 A1 3/2008 Silverbrook
2009/0146230 A1 6/2009 Takizawa
2010/0140670 A1 * 6/2010 Peczalski ............ B81C 1/00246 257/E21.532
2010/0277551 A1 11/2010 Silverbrook
2010/0330722 A1 12/2010 Hsieh et al.
2011/0037813 A1 * 2/2011 Nakatani ................ B41J 2/1639 347/70
2011/0169892 A1 7/2011 Silverbrook
2011/0198970 A1 8/2011 Martin et al.
2011/0304412 A1 12/2011 Zhang
2012/0242756 A1 9/2012 Nystrom et al.
2014/0063095 A1 * 3/2014 Yokoyama ........... B41J 2/14201 29/25.35
2014/0091410 A1 4/2014 Celik-Butler et al.
2014/0265726 A1 9/2014 Andosca
2015/0340592 A1 11/2015 Pirk et al.
2017/0199357 A1 7/2017 Craen et al.
2017/0358620 A1 12/2017 Chen et al.
2019/0267536 A1 8/2019 Apte et al.
2019/0283424 A1 9/2019 Mcavoy
2019/0329551 A1 10/2019 Giusti et al.
2019/0367357 A1 12/2019 Giusti et al.
2020/0270121 A1 8/2020 Yang et al.
2020/0391510 A1 12/2020 Mcavoy

FOREIGN PATENT DOCUMENTS

DE 10 2011 018 588 10/2012
EP 1 121 249 7/2007
JP 2000-289201 10/2000
JP 2005-144186 6/2005
JP 2009-139339 6/2009
JP 2010-5900 1/2010
JP 2014-46580 3/2014
WO 2013/026764 2/2013
WO 2016/041913 3/2016
WO 2019/150115 8/2019

OTHER PUBLICATIONS

International Search Report and Written Opinion of the ISA for PCT/EP2021/074187 dated Nov. 15, 2021, 20 pages.
Office Action dated Jun. 24, 2025, issued for Japanese Application No. 2023-513961 (7 pages) and Translation (6 pages).

* cited by examiner

MEMS DEVICE WITH INTEGRATED CMOS CIRCUIT

CROSS-REFERENCE TO RELATED APPLICATIONS

This application is the U.S. national phase of International Application No. PCT/EP2021/074187 filed Sep. 1, 2021 which designated the U.S. and claims priority to GB Patent Application No. 2013718.8 filed Sep. 1, 2020, and EP patent application No. 20205033.2 filed Oct. 30, 2020, the entire contents of each of which are hereby incorporated by reference.

Field of the Invention

The present invention relates to a Micro-Electro-Mechanical Systems, MEMS, device having an integrated CMOS circuit and a method of manufacturing the same.

Background to the Invention

MEMS devices are used in a wide variety of applications. Typically, the device comprises a MEMS component controlled using control circuitry or interfacing with sense circuitry. One possible type of MEMS component is an actuator, such as a piezoelectric actuator.

One application for piezoelectric actuators is for printers including inkjet printers, but also used with additive manufacturing, textiles, biotechnology and pharmaceutical applications. Inkjet printers are used to recreate digital images on a print medium (such as paper) by propelling droplets of ink onto the medium. Many inkjet printers incorporate "drop on demand" technology wherein the sequential ejection of individual ink droplets from the inkjet nozzle of a printhead is controlled. The ink droplets are ejected with sufficient momentum that they adhere to the medium. Each droplet is ejected according to an applied drive signal, which differentiates drop on demand inkjet printers from continuous inkjet devices where a continuous stream of ink droplets is generated by pumping ink through a microscopic nozzle. One successful drop on demand technology is piezoelectric inkjet printers. Piezoelectric inkjet printers incorporate a piezoelectric actuator into a wall of a fluid chamber. Deformation of a piezoelectric element causes deflection of the piezoelectric actuator, inducing a pressure change in the printing fluid stored within the fluid chamber and thereby causing droplet ejection through a nozzle.

WO 2018/054917 A1 relates to a droplet ejector for a printhead and comprises an electronic component integrated with a substrate and electrically connected to first and second electrodes having a piezoelectric actuator provided therebetween. A material forming the nozzle-forming layer extends over the electronic component and also defines a fluid chamber outlet of a fluid chamber. The piezoelectric actuator overlays the nozzle-forming layer.

US 2011/0169892 A1 relates to a nozzle for an inject printer including a roof layer defining a nozzle port, a substrate layer defining a nozzle chamber wall supporting the roof layer, an actuator assembly attached to the substrate, the actuator assembly including a support and a lever arm cantilevered from the support to terminate in a piston within the nozzle chamber wall, and a solenoid provided at an end of the lever arm opposite to that of the piston, the solenoid including a movable magnetic pole and a fixed magnetic pole spaced apart from the movable magnetic pole.

It is in this context that the present disclosure has been devised.

SUMMARY OF THE INVENTION

In accordance with an aspect of the present disclosure there is provided a method of manufacturing a Micro-Electro-Mechanical Systems, MEMS, device. The MEMS device comprises a Micro-Electro-Mechanical component and an integrated circuit configured to be in conductive communication with the Micro-Electro-Mechanical component. The method comprises: forming a plurality of integrated circuit layers on a substrate to form the integrated circuit, the plurality of integrated circuit layers comprising a plurality of integrated circuit passivation and metallisation layers; removing a portion of at least one of the plurality of integrated circuit passivation and metallisation layers in a component region of the device; and forming one or more component region layers in place of the removed portion in the component region to form the movable Micro-Electro-Mechanical component, the one or more component region layers different from the portion of the at least one of the plurality of integrated circuit passivation and metallisation layers.

Thus, the component need not include at least some of the integrated circuit layers, which are typically chosen for their functionality in the integrated circuit, not for the component; as a result, the component region layers can be chosen specifically to provide desired properties of the movable Micro-Electro-Mechanical component.

Such properties may include Young's modulus, thickness, or density. Furthermore, by removing and replacing functionally redundant layers in the component region, the MEMS device can be particularly compact because the component need not include at least some of the redundant layers. It will be understood that the method typically comprises removing exactly a portion of the at least one of the plurality of integrated circuit passivation and metallisation layers. In other words, not all of the at least one layer is removed.

It will be further understood that integrated circuit layers are layers providing an integrated circuit for the MEMS device. Similarly, it will be understood that the component region layers are any layers forming part of the movable MEMS component, and therefore not forming part of the integrated circuit of the MEMS device.

The plurality of integrated circuit layers may be a plurality of CMOS circuit layers. Thus, in accordance with a further aspect of the present disclosure there is provided a method of manufacturing a Micro-Electro-Mechanical Systems, MEMS, device. The MEMS device typically comprises a movable Micro-Electro-Mechanical component and a CMOS circuit configured to be in conductive communication with the Micro-Electro-Mechanical component. The method comprises: forming a plurality of CMOS circuit layers on a substrate to form the CMOS circuit, the plurality of CMOS circuit layers comprising a plurality of CMOS passivation and metallisation layers; removing a portion of at least one of the plurality of CMOS passivation and metallisation layers in a component region of the device; and forming one or more component region layers in place of the removed portion in the component region to form the movable Micro-Electro-Mechanical component, the one or more component region layers different from the portion of the at least one of the plurality of CMOS passivation and metallisation layers.

Thus, the component region need not include at least some of the CMOS circuit layers, which are typically chosen for their functionality in the CMOS circuit, not for the component; as a result, the one or more component region layers can be chosen specifically to provide desired properties of the movable Micro-Electro-Mechanical component. Such properties may include Young's modulus, thickness, or density.

The one or more component region layers may each have a Young's modulus greater than 10 gigapascals. The one or more component region layers may each have a Young's modulus less than 1,200 gigapascals, for example less than 700 gigapascals.

In some examples, the stiffness of the one or more component region layers is less than (e.g., less than half) the stiffness of the removed portion. In other words, the one or more component region layers are more flexible than the portion which they replaced. Thus, the flexibility is increased.

In other examples, the stiffness of the one or more component region layers may be greater than (e.g., more than double) the stiffness of the removed portion. Thus, the actuation force can be increased.

Furthermore, by removing and replacing the redundant layers in the component region, the MEMS device can be particularly compact because the component need not include at least some of the redundant layers.

Yet further, the approach allows for the deposition of MEMS passivation features as one of the component region layers using processes that have a particularly good tolerance control of material properties and thicknesses. It will be understood that the CMOS circuit is subject to multiple processing steps during formation to optimize electrical performance. Such processing steps can be to the detriment of mechanical and structural aspects important for the MEMS functionality. Therefore, it is beneficial that at least some of the CMOS passivation and metallisation layers can be removed and replaced in the component region where the MEMS component is formed. This is particularly important for an array of multiple MEMS components devices. Accordingly, the approach reduces processing variation and increases wafer yield. It will be understood that the plurality of integrated circuit passivation and metallisation layers may together form one or more integrated circuit metallisation features within the plurality of integrated circuit layers, surrounded by an integrated circuit passivation region. Similarly, it. will be understood that the plurality of CMOS passivation and metallisation layers may together form one or more CMOS metallisation features within the plurality of CMOS circuit layers, surrounded by a CMOS passivation region.

The plurality of CMOS passivation and metallisation layers may comprises a plurality of CMOS passivation layers and a plurality of CMOS metallisation layers.

The one or more component region layers are at least partially different from the portion of the at least one of the one or more CMOS circuit layers.

The one or more component region layers may be a plurality of at least two different component region layers.

Metallisation in the context of the CMOS passivation and metallisation layers will be understood to be substantially any region of the integrated circuit, such as the CMOS circuit, that provides an interconnect between components of the integrated circuit, or between the integrated circuit and an external connector to the integrated circuit. The metallisation region may be formed from a metal, such as aluminium, copper, an aluminium copper alloy, or any other suitable alloy.

Passivation in the context of the CMOS passivation and metallisation layers will be understood to be substantially any region of the integrated circuit, such as the CMOS circuit, that provides electrical stability to the integrated circuit by isolating one or more components, such as a transistor surface, of the integrated circuit from electrical and/or chemical conditions in the environment. The passivation region May be formed from an insulating material, such as an oxide, a nitride, a carbide, a combination of these, such as a laminate of these.

The substrate is typically formed from silicon. The substrate may be formed from a silicon wafer.

It will be understood that the terms "metallisation region" and "passivation region" are well understood by the skilled person.

The CMOS circuit typically further comprises a plurality of circuit layers forming a plurality of transistors operable together for the CMOS circuit to function as control circuitry (i.e., a controller). As will be appreciated, the typical fabrication process for a CMOS metallisation layer or a CMOS passivation layer includes a polishing step to prepare the layer for application of a further layer thereon. Polishing (sometimes referred to as a chemical-mechanical-polishing, CMP, step) is typically not possible to do in only a localised sub-region of a layer, having a clearly-defined boundary. Therefore, typically the whole layer is polished. For this reason, it will be understood that the CMOS passivation and metallisation layers are applied across the whole substrate, and must be subsequently removed in any regions of the substrate in which they are undesirable.

Removing the portion of the at least one of the plurality of CMOS passivation and metallisation layers may comprise removing the portion of more than one of the plurality of CMOS passivation and metallisation layers in the component region of the device. Removing the portion of the at least one of the plurality of CMOS passivation and metallisation layers may comprise removing the portion of each of the plurality of CMOS passivation and metallisation layers in the component region of the device.

Thus, none of the CMOS passivation and metallisation layers remain in the component region; accordingly, the component region of the device can be formed entirely from layers which are different to the plurality of CMOS passivation and metallisation layers.

Removing the portion of the at least one of the plurality of CMOS passivation and metallisation layers may comprise etching the layers to be removed. Thus, the layers can be removed using a simple process commonly used in manufacture of integrated circuits.

The etching may be deep reactive ion etching, DRIE. Alternatively, the etching may be a standard passivation etch for the removal of one or more passivation regions in the CMOS passivation and metallisation layers.

The etching may be only to a position part way through an assembly of the substrate, and the plurality of CMOS passivation and metallisation layers. The etching may be performed from a side of the component region opposite the substrate. Thus, the etch can remove the plurality of CMOS passivation and metallisation layers in the component region up to the substrate.

At least one of the one or more component region layers may be formed from a material different from an adjacent layer among the plurality of CMOS circuit layers. The adjacent layer may be level with the at least one of the one or more component region layers. Thus, the different functional properties of the one or more component region layers compared with the plurality of CMOS circuit layers in place of which they are provided may be achieved using a different material configuration. The material may be different from any of those used for any layers among the plurality of CMOS circuit layers.

In other examples, at least one of the one or more component region layers may be formed to have a thickness different from an adjacent layer among the plurality of CMOS circuit layers. The at least one of the one or more component region layers may be formed from the same material as the adjacent layer in this case. The at least one of the one or more component region layers may be formed as a single layer, or a laminate of different materials.

Forming the one or more component region layers may comprise depositing a MEMS passive (e.g., passivation) layer in place of the removed portion. The MEMS passive layer may extend over the plurality of CMOS passivation and metallisation layers outside the component region. The MEMS passive layer may be formed from a material different to the CMOS passivation regions in the plurality of CMOS passivation and metallisation layers. In other examples, the MEMS passive layer may be formed from the same material but a different thickness to the CMOS passivation regions in the plurality of CMOS passivation and metallisation layers, or a single layer, or a laminate of different materials. Thus, the MEMS passive layer is configured to be particularly suitable for use in the structure of the Micro-Electro-Mechanical component in the component region.

The MEMS passive layer may be a layer different to any further component region layers functionally involved during operation of the MEMS component.

In some examples, the MEMS passive layer may be formed from a material unsuitable for use as a CMOS passivation region formed from the plurality of CMOS passivation and metallisation layers.

Viewed from a further aspect, the present disclosure provides a Micro-Electro-Mechanical Systems, MEMS, device comprising a substrate having a CMOS circuit integrally provided therewith. The CMOS circuit is formed by a plurality of CMOS circuit layers including a plurality of CMOS passivation and metallisation layers. The CMOS circuit is arranged in a CMOS circuit region of the MEMS device. The MEMS device further comprises a movable Micro-Electro-Mechanical component configured to be controlled by the integrated circuit and arranged in a component region of the MEMS device. The component region is distinct from the CMOS circuit region. The component region comprises one or more component region layers including the Micro-Electro-Mechanical component. The or each of the one or more component region layers in the component region is different from each of the plurality of CMOS passivation and metallisation layers, of the integrated circuit region.

Thus, the component is formed from layers not chosen for their functionality as CMOS passivation or CMOS metallisation layers of the CMOS circuit.

The CMOS circuit region may be adjacent the component region in a direction parallel to a plane of the substrate.

The substrate may comprise a first surface having a one of the plurality of CMOS passivation and metallisation layers formed thereon. In the component region, the component region layers may extend to be planar with the first surface.

A one of the one or more component region layers may be a MEMS passive layer. Thus, further component region layers can be provided with electrical stability and chemical isolation relative to the plurality of CMOS passivation and metallisation layers in the integrated circuit region.

The one or more component region layers may sometimes be referred to as replacement layers.

The MEMS passive layer may overlay the plurality of CMOS passivation and metallisation layers in the integrated circuit region. Thus, the MEMS passive layer may provide further electrical and chemical isolation from the environment for the CMOS circuit components.

The MEMS passive layer may define an opening therein for providing an electrical connection to a CMOS metallisation region of the plurality of CMOS passivation and metallisation layers of the CMOS circuit. The electrical connection may be provided via a MEMS metallisation component, connecting the CMOS metallisation region to at least one of a first electrode and a second electrode of the Micro-Electro-Mechanical component.

The method may comprise forming the opening in the MEMS passive layer. The opening may be formed by etching. The etching may be deep reactive ion etching, DRIE or standard CMOS passivation etch methods.

The MEMS device may comprise an encapsulation layer overlaying the Micro-Electro-Mechanical component, the MEMS passive layer, and the MEMS metallisation layer. The method may comprise forming the encapsulation layer, for example by deposition.

The substrate may define an opening in the component region thereof. The Micro-Electro-Mechanical component may comprise a cantilever extending over the opening. The Micro-Electro-Mechanical component may comprise a diaphragm extending over the opening.

One or more of the openings described hereinbefore may have etched sides.

The method may comprise forming the opening in the substrate in the component region thereof. Thus, when the opening in the substrate is formed in the component region, the one or more component region layers can be released from the substrate in the component region, whereby to be more easily flexed (i.e., moved) relative to the portions of the device outside the component region.

The opening in the substrate may be formed by etching. The etching may be deep reactive ion etching, DRIE or other methods such as anisotropic wet etch.

The opening in the substrate may be formed from the side of the substrate opposite the Micro-Electro-Mechanical component. The opening in the substrate may extend to the one or more component region layers. The opening in the substrate May extend to the MEMS passive layer. In this way, when the opening in the substrate is formed by etching, the one or more component region layers may be configured to function as an etch-stop. In other words, the etch typically proceeds no further than the etch-stop.

The MEMS device may further comprise a nozzle opening through the MEMS passive layer and the encapsulation layer to allow fluid to pass between a fluid chamber defined at least partially by the substrate and an external environment of the MEMS device, through the opening in the MEMS passive layer and the encapsulation layer.

The Micro-Electro-Mechanical component may be a plurality of Micro-Electro-Mechanical components. Each of the plurality of Micro-Electro-Mechanical components may define a respective nozzle opening in the component region. Thus, the MEMS device can include a plurality of nozzle openings. Each of the Micro-Electro-Mechanical components may be electrically connected to the CMOS circuit.

Each of the Micro-Electro-Mechanical components may be configured to be controlled by the CMOS circuit. Thus, control can be provided to the plurality of Micro-Electro-Mechanical components by the CMOS circuit.

The method may further comprise forming the nozzle opening. The nozzle opening may be formed by etching. The etching may be deep reaction ion etching, DRIE or other conventional CMOS passivation etch. The nozzle opening may be formed from the side of the MEMS device opposite the substrate.

In some examples, the nozzle opening may be formed before formation of the substrate opening. In other examples, the nozzle opening may be formed subsequent to formation of the substrate opening.

The Micro-Electro-Mechanical component may be a piezoelectric component. In other words, the Micro-Electro-Mechanical component may include one or more 34 regions of piezoelectric material used functionally in the Micro-Electro-Mechanical component.

The Micro-Electro-Mechanical component may be an actuator.

The actuator may be a piezoelectric actuator.

The actuator may comprise a first electrode, a second electrode and a piezoelectric actuator body provided between the first electrode and the second electrode. At least one of the first electrode and the second electrode may be electrically connected to the CMOS circuit via one or more of the CMOS metallisation regions of the plurality of CMOS passivation and metallisation layers.

The piezoelectric component typically comprises a piezoelectric body provided between first and second electrodes. At least one of the said first and second electrodes is typically electrically connected to at least one electronic component (e.g. of the CMOS circuit). The piezoelectric body typically comprises (e.g. is formed from) one or more piezoelectric materials processable at a temperature below 450° C.

Above 300° C., integrated electronic components (e.g. CMOS electronic components) typically begin to degrade, impairing device operation and reducing efficiency. Above 450° C., integrated electronic components (e.g. CMOS electronic components) typically degrade even more substantially. Use of piezoelectric materials processable at a temperature below 450° C. therefore permits processing of, and integration of, the piezoelectric component with the at least one electronic component (e.g. of the drive circuitry) without substantial damage to the said at least one electronic component.

It may be that the piezoelectric body comprises (e.g. is formed from) one or more piezoelectric materials processable at a temperature below 300° C. Use of piezoelectric materials processable at a temperature below 300° C. permits processing of, and integration of, the piezoelectric component with the at least one electronic component (e.g. of the drive circuitry) with even less damage to the said at least one electronic component. Use of piezoelectric materials processable at a temperature below 300° C. typically permits a higher yield of functioning devices to be achieved from large-scale manufacture of multiple MEMS devices on a single substrate (e.g. from a single substrate wafer).

By integrating the piezoelectric component with the least one electronic component (e.g. drive electronics), the need to provide separate drive electronics is reduced or removed. A large number of piezoelectric components may therefore be closely integrated on one chip, increasing the component per chip, reducing the overall device size, and permitting a higher component density than is achievable with existing MEMS devices having piezoelectric MEMS components. Other benefits associated with integration on a single chip include eventual manufacturing cost reductions, modularity and device reliability.

Piezoelectric materials which are processable below 450° C. (or below 300° C.) typically have poorer piezoelectric properties (e.g. lower piezoelectric constants) than piezoelectric materials which require processing at higher temperatures. For example, a piezoelectric actuator formed from a high-temperature processable piezoelectric material such as lead zirconate titanate (PZT) is able to exert a force over an order of magnitude greater than a piezoelectric actuator formed from a low-temperature processable piezoelectric material such as aluminium nitride (AlN), all other factors being equal.

The one or more piezoelectric materials are typically processable (e.g. depositable and, if required, annealable) at a temperature below 450° C. (or below 300° C.) such that the piezoelectric component is manufacturable at a temperature below 450° C. (or below 300° C.). Manufacture of the piezoelectric component at a temperature below 450° C. (or below 300° C.) permits integration of the piezoelectric component with the at least one electronic component integrated with the substrate.

The piezoelectric body is therefore typically formable (e.g. by deposition and, if required, annealing of the one or more piezoelectric materials) at a temperature below 450° C. (or below 300° C.).

The one or more piezoelectric materials are typically processable (e.g. depositable and, if required, annealable) at a substrate temperature below 450° C. (or below 300° C.). In other words, the temperature of the substrate does not typically reach or exceed 450° C. (or 300° C.) during processing (e.g. deposition and, if required, annealing) of the one or more piezoelectric materials. The temperature of the substrate does not typically reach or exceed 450° C. (or 300° C.) during formation of the piezoelectric body. The temperature of the substrate does not typically reach of exceed 450° C. (or 300° C.) during manufacture of the piezoelectric component. It may be that the temperature of the substrate does not reach or exceed 450° C. (or 300° C.) during manufacture of the (e.g. entire) MEMS device.

The piezoelectric body may comprise (e.g. be formed from) one piezoelectric material. Alternatively, the piezoelectric body may comprise (e.g. be formed from) more than one piezoelectric material.

The piezoelectric body may comprise (e.g. be formed from) a ceramic material comprising aluminium and nitrogen and optionally one or more elements selected from: scandium, yttrium, titanium, magnesium, hafnium, zirconium, tin, chromium, boron.

The piezoelectric body may comprise (e.g. be formed from) aluminium nitride (AlN).

The piezoelectric body may comprise (e.g. be formed from) zinc oxide (ZnO).

The one or more piezoelectric materials may comprise (e.g. consist of) aluminium nitride and/or zinc oxide.

Aluminium nitride may consist of pure aluminium nitride. Alternatively, aluminium nitride may comprise one or more elements (i.e. aluminium nitride may comprise aluminium nitride compounds). Aluminium nitride may comprise one or more of the following elements: scandium, yttrium, titanium, magnesium, hafnium, zirconium, tin, chromium, boron.

The piezoelectric body may comprise (e.g. be formed from) scandium aluminium nitride (ScAlN). The percentage of scandium in scandium aluminium nitride is typically chosen to optimize the $d_{31}$ piezoelectric constant within the limits of manufacturability. For example, the value of x in $Sc_xAl_{1-x}N$ is typically chosen from the range $0<x\leq0.5$. Greater fractions of scandium typically result in larger values of $d_{31}$ (i.e. stronger piezoelectric effects). The mass percentage (i.e. the weight percentage) of scandium in scandium aluminium nitride is typically greater than 5%. The mass percentage (i.e. the weight percentage) of scandium in scandium aluminium nitride is typically greater than 10%. The mass percentage (i.e. the weight percentage) of scandium in scandium aluminium nitride is typically greater than 20%. The mass percentage (i.e. the weight percentage) of scandium in scandium aluminium nitride is typically greater than 30%. The mass percentage (i.e. the weight percentage) of scandium in scandium aluminium nitride is typically greater than 40%. The mass percentage (i.e. the weight percentage) of scandium in scandium aluminium nitride may be less than or equal to 50%.

Aluminium nitride, including aluminium nitride compounds (and in particular scandium aluminium nitride), and zinc oxide are piezoelectric materials which may be deposited below 450° C., or more preferably below 300° C. Aluminium nitride, including aluminium nitride compounds (and in particular scandium aluminium nitride), and zinc oxide are piezoelectric materials which may be deposited by physical vapour deposition (e.g. sputtering) below 450° C., or more preferably below 300° C. Aluminium nitride, including aluminium nitride compounds (and in particular scandium aluminium nitride), and zinc oxide are piezoelectric materials which do not typically require annealing after deposition.

The piezoelectric body may comprise (e.g. be formed from) aluminium nitride (e.g. aluminium nitride compounds, for example scandium aluminium nitride) and/or zinc oxide deposited by physical vapour deposition below 450° C., or more preferably below 300° C.

The piezoelectric body may comprise (e.g. be formed from) one or more III-V and/or II-VI semiconductors (i.e. compound semiconductors comprising elements from Groups III and V and/or Groups II and VI of the Periodic Table). Such III-V and II-VI semiconductors typically crystallise in the hexagonal wurtzite crystal structure. III-V and II-VI semiconductors crystallising in the hexagonal wurtzite crystal structure are typically piezoelectric due to their non-centrosymmetric crystal structure.

The piezoelectric body may comprise (e.g. be formed from or consist of) non-ferroelectric piezoelectric materials. The one or more piezoelectric materials may be one or more non-ferroelectric piezoelectric materials. Ferroelectric materials typically require (i.e. post-deposition) poling under strong applied electric fields. Non-ferroelectric piezoelectric materials typically do not require poling.

The piezoelectric body typically has a piezoelectric constant $d_{31}$ having a magnitude less than 30 pC/N, or more typically less than 20 pC/N, or even more typically less than 10 pC/N. The one or more piezoelectric materials typically have piezoelectric constants $d_{31}$ having magnitudes less than 30 pC/N, or more typically less than 20 pC/N, or even more typically less than 10 pC/N.

The one or more piezoelectric materials are typically CMOS-compatible. By this, it will be understood that the one or more piezoelectric materials do not typically comprise, or are typically processable (e.g. depositable, and if required, annealable) without use of, substances which damage CMOS electronic structures. For example, processing (e.g. deposition, and if required, annealing) of the one or more piezoelectric materials does not typically include use of (e.g. strong) acids (such as hydrochloric acid) and/or (e.g. strong) alkalis (such as potassium hydroxide).

It will be understood by the skilled person that alternative actuator designs are also possible, such as a plurality of actuators having a plurality of electrodes.

The method may comprise depositing the Micro-Electro-Mechanical component on the MEMS passive layer. The Micro-Electro-Mechanical component may be deposited using physical vapour deposition (PVD) methods. Specifically, the piezoelectric actuator body is typically deposited using physical vapour deposition methods.

The piezoelectric actuator body may comprise one or more PVD-depositable piezoelectric materials.

The MEMS device may be a droplet ejector for a printhead. Thus, the actuator can be used to expel droplets from the printhead. In other words, the present disclosure May extend to the printhead. The printhead may be an inkjet printhead. The droplet ejector may be a droplet ejector for (e.g. configured for use in) an inkjet printhead. The droplet ejector may be an inkjet droplet ejector.

The printhead may be configured to print fluids (e.g. functional fluids) for use in the manufacture of printed electronics.

The printhead may be configured to print biological fluids. Biological fluids typically comprise biological macromolecules, e.g. polynucleotides, such as DNA or RNA, microorganisms, and/or enzymes. The printhead may be configured to print other fluids used in biological or biotechnological applications, such as diluents or reagents.

The printhead may be a voxel printhead (i.e. a printhead configured for use in 3D printing, e.g. additive printing). The printhead is typically for a printer. Thus, the present disclosure extends to a printer comprising one or more of the printheads. It will be understood that a printer is substantially any apparatus arranged to expel printing material (e.g. printing liquid, such as ink) to create a desired appearance (e.g., colour) and/or shape and/or function of a printed object. The printer may be a 2D printer arranged to print coloured ink onto a substrate (e.g., paper). In other examples, the printer may be an additive manufacturing device (i.e. a 3D printer) configured to create a 3D object by expelling printing material from one or more printheads of the printer.

Thus, viewed from another aspect, the present disclosure extends to a printer comprising one or more printheads comprising the MEMS droplet ejector described hereinbefore. The printer may be configured to eject printing liquid (e.g., ink) from the MEMS droplet ejector by controlling operation of the MEMS piezoelectric actuator to cause at least one of the one or more component region layers to flex, whereby to expel the printing liquid therefrom. The printer may further comprise a source of the printing liquid. The source of the printing liquid may be a printing liquid cartridge.

Viewed from a further aspect, the present disclosure also extends to a method of printing. The method comprises providing print apparatus including a printer as described hereinbefore. The apparatus comprises the source of printing liquid. It May be that the source of printing liquid (e.g., ink) is part of the printer. The printer comprises one or more printheads, each comprising one or more droplet ejectors as described hereinbefore. The method comprises controlling at least one of the one or more droplet ejectors such that the actuator is caused to flex at least one of the one or more component region layers, whereby to eject printing liquid from the droplet ejector. Thus, the printer uses the printing liquid to print.

The actuator may be to generate sound, such as for a PMUT or a speaker. The actuator may be for a fluidic pump.

The Micro-Electro-Mechanical component may be a sensor component. The sensor component may be a piezoelectric sensor component. In other words, movement of the Micro-Electro-Mechanical component may be converted to an electrical signal which can be conducted to the CMOS circuit. The sensor component may be a microphone, a pressure sensor, or a biosensor.

According to a yet further aspect of the present disclosure, there is provided a Micro-Electro-Mechanical Systems, MEMS, device comprising: a substrate having a CMOS circuit integrally provided therewith. The CMOS circuit is formed by a plurality of CMOS circuit layers including a plurality of CMOS passivation and metallisation layers, the plurality of CMOS passivation and metallisation layers together defining a plurality of CMOS metallisation regions surrounded by one or more CMOS passivation regions. The plurality of CMOS passivation and metallisation layers together extend between a first plane defined by a one of the plurality of CMOS passivation and metallisation layers bordering the substrate and a second plane defined parallel to the first plane and by an furthest one of the plurality of CMOS passivation and metallisation layers. The CMOS circuit is arranged in a CMOS circuit region of the MEMS device. The MEMS device further comprises a movable Micro-9 Electro-Mechanical component configured to be controlled by the integrated circuit and arranged in a component region of the MEMS device. The component region is distinct from the CMOS circuit region. The component region comprises one or more component region layers including the Micro-Electro-Mechanical component. At least one of the one or more component region layers extends to the first plane. The at least one of the one or more component region layers extending to the first plane is different from the one of the plurality of CMOS passivation and metallisation layers bordering the substrate.

Thus, in the same plane as the plurality of CMOS passivation and metallisation layers, the corresponding layer in the component region of the MEMS device is different.

Typically, the one or more component region layers extending to the first plane are adjacent the plurality of CMOS passivation and metallisation layers. The one or more component region layers extending to the first plane may extend from the same side of the substrate as the plurality of CMOS passivation and metallisation layers. The at least one of the one or more component region layers extending to the first plane May extend in a direction from the second plane to the first plane.

The first plane may be defined as a border between the one of the plurality of CMOS passivation and metallisation layers bordering the substrate and the substrate.

In some examples, the at least one of the one or more component region layers extending to the first plane is formed from a different material from the one of the plurality of CMOS passivation and metallisation layers bordering the substrate. In other examples, the at least one of the one or more component region layers extending to the first plane is formed from the same material as the one of the plurality of CMOS passivation and metallisation layers bordering the substrate, but having a different thickness.

A thickness of the MEMS passive layer may be less than a combined thickness of the plurality of CMOS passivation and metallisation layers. Alternatively, the thickness of the MEMS passive layer may be greater than the combined thickness of the plurality of CMOS passivation and metallisation layers.

The MEMS passive layer may have a substantially similar thickness in the component region as in the CMOS circuit region.

A surface of the MEMS passive layer, facing away from the substrate, in the component region may be substantially coplanar with the surface of the MEMS passive layer, facing away from the substrate, in the CMOS circuit region.

The MEMS passive layer may be formed from a plurality of layers, the plurality of layers being formed from at least two different materials.

The MEMS device may comprise a plurality of Micro-Electro-Mechanical components provided outside the CMOS circuit region. The CMOS circuit may be in electrical communication with more than one of the plurality of Micro-Electro-Mechanical components.

The MEMS device may comprise a plurality of CMOS circuits provided outside the component region. The plurality of CMOS circuits may include a plurality of CMOS circuits of different types. The plurality of CMOS circuits may comprise at least one HV CMOS circuit and at least one LV CMOS circuit. Additionally or alternatively, the plurality of CMOS circuits may be partitioned by one or more Deep Trench Isolation (DTI) structures.

In some examples, each CMOS circuit is in electrical communication with a respective one of a plurality of Micro-Electro-Mechanical components provided outside the CMOS circuit region.

The substrate may comprise one or more bond pads.

The MEMS device may be configured such that the Micro-Electro-Mechanical component is electrically connected to the CMOS circuit via a MEMS metallisation layer provided as a one of the one or more component region layers.

DESCRIPTION OF THE DRAWINGS

An example embodiment of the present invention will now be illustrated with reference to the following Figures in which.

DETAILED DESCRIPTION OF AN EXAMPLE EMBODIMENT

Figures 1, 2:
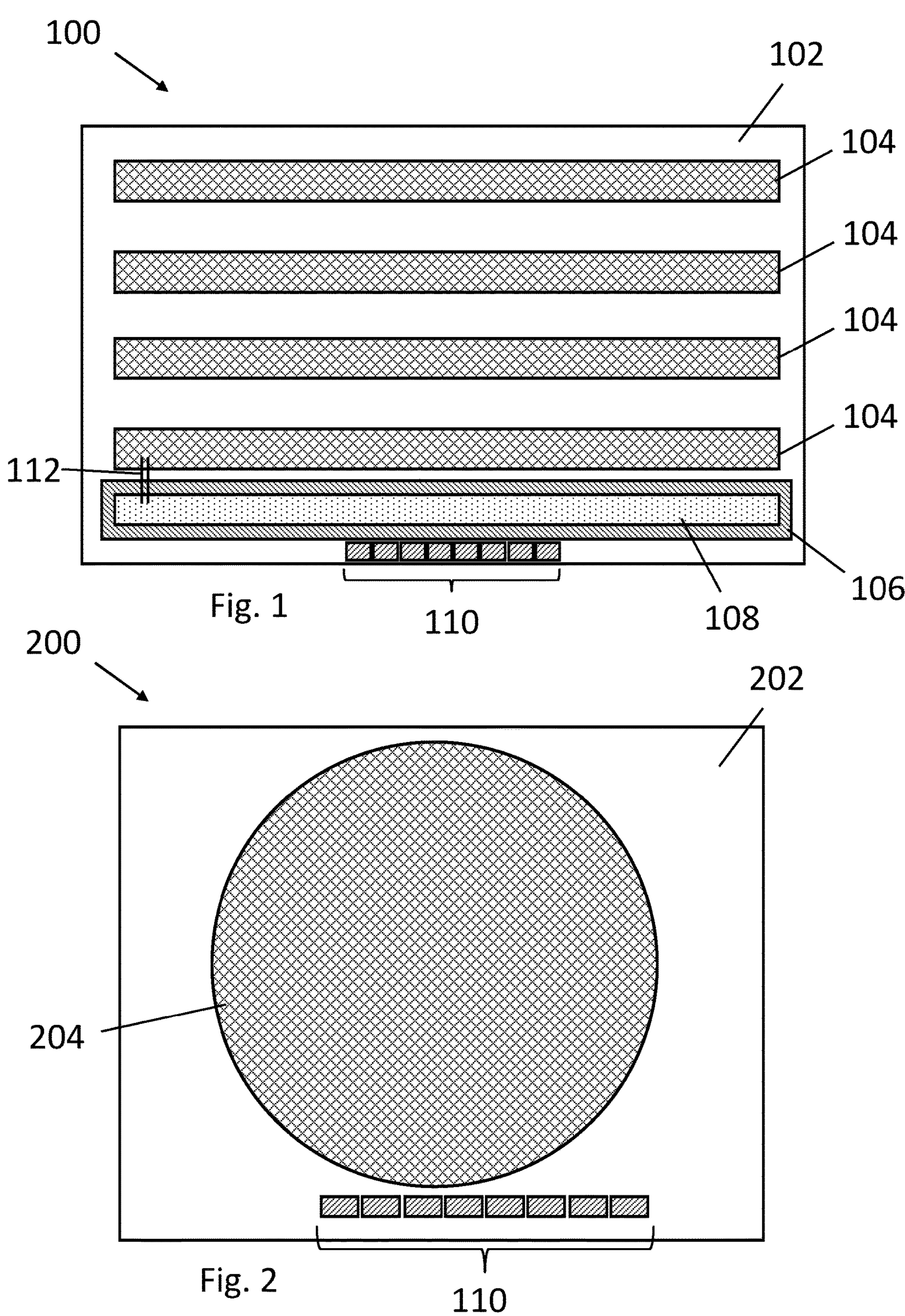
FIG. 1 shows an example of a Micro-Electro-Mechanical Systems device in the form of a printhead.
FIG. 2 shows a further example of a Micro-Electro-Mechanical Systems device.

FIG. 1 shows a schematic indicative illustration of a Micro-Electro-Mechanical Systems printhead. The Micro-Electro-Mechanical Systems (MEMS) printhead 100 is formed with an integrated circuit passivation region 102, in the form of a complementary metal-oxide semiconductor (CMOS) passivation region 102 surrounding one or more, in this case a plurality of, non-CMOS passivation regions 104 on a substrate (not shown), in the form of MEMS passivation regions 104 on the substrate. It will be understood that in the view shown in FIG. 1, the substrate is hidden by the covering regions, including the CMOS passivation region 102 and the non-CMOS passivation region 104. The non-CMOS passivation regions 104 are suitable for being provided with one or more MEMS components thereat.

In this example, the MEMS printhead 100 further comprises integrated circuit isolation structures 106 (such as high voltage isolation caps or high voltage deep trench isolation features), specifically in the form of CMOS isolation structures 106, surrounding an integrated circuit transistor region 108 in the form of a CMOS transistor region 108. The CMOS isolation structures 106 and the CMOS transistor region 108 are spaced from the non-CMOS passivation regions 104 by the CMOS passivation region 102. The MEMS printhead 100 further comprises bond pads 110 connected to the CMOS via the CMOS passivation region 102. MEMS metallisation lines 112 electrically connect the CMOS transistor region 108 to a MEMS component (not shown) in a one of the non-CMOS passivation regions 104. In this way, MEMS components in the non-CMOS passivation regions 104 can be controlled by the CMOS transistor region 108, functioning as a controller.

In this example, the CMOS passivation region 102 is formed from a material different to that of the non-CMOS passivation region 104, such as the MEMS passivation region 104. In this way, it will be understood that the material used for the non-CMOS passivation region 104 need not be a material suitable for use in the CMOS passivation region 102, but instead is a material chosen specifically for its functionality in a MEMS component in the non-CMOS passivation region 104. In other examples, the CMOS passivation region 102 is formed from the same material as the non-CMOS passivation region 104, but is otherwise different, such as having a different thickness.

As will be described further hereinafter, the CMOS passivation region 102 is typically formed by deposition of a plurality of layers of the deposition material.

In this example, the MEMS components are typically piezoelectric actuators, controllable to expel droplets of ink and function as a droplet ejector of the inkjet printhead, as will be understood by a person skilled in the art.

FIG. 2 shows a further example of a Micro-Electro-Mechanical Systems device, such as a sensor or actuator. Analogously to FIG. 1, the MEMS device 200 comprises an integrated circuit passivation region 202 in the form of a CMOS passivation region 202, a non-CMOS passivation region 204 surrounded by the CMOS passivation region 202, and a plurality of bond pads 210 provided in the CMOS passivation region 202. The non-CMOS passivation region 204 includes one or more MEMS components electrically connected to a CMOS chip via metallisation connections (not shown) through the CMOS passivation layer region 202. In this example, the MEMS component is a sensor component, such as a Piezoelectric Micromachined Ultrasonic Transducer (PMUT), a microphone or other pressure sensor. In this way, a compact MEMS sensor device can be provided. In other examples, the MEMS component is an actuator component, such as for use in a PMUT, a speaker or a fluidic pump. As with the printhead described with reference to FIG. 1, the non-CMOS passivation layer region 204 is formed from a material different from the material used to form the CMOS passivation layer region 202, such as a material not suitable for use as the CMOS passivation layer region 202.

The examples shown in FIGS. 1 and 2 can also provide a higher yield process, as described elsewhere herein.

FIGS. 3*a* to 3*f* show stages of manufacture of a Micro-Electro-Mechanical Systems device in accordance with an aspect of the present disclosure.

Figure 3A:
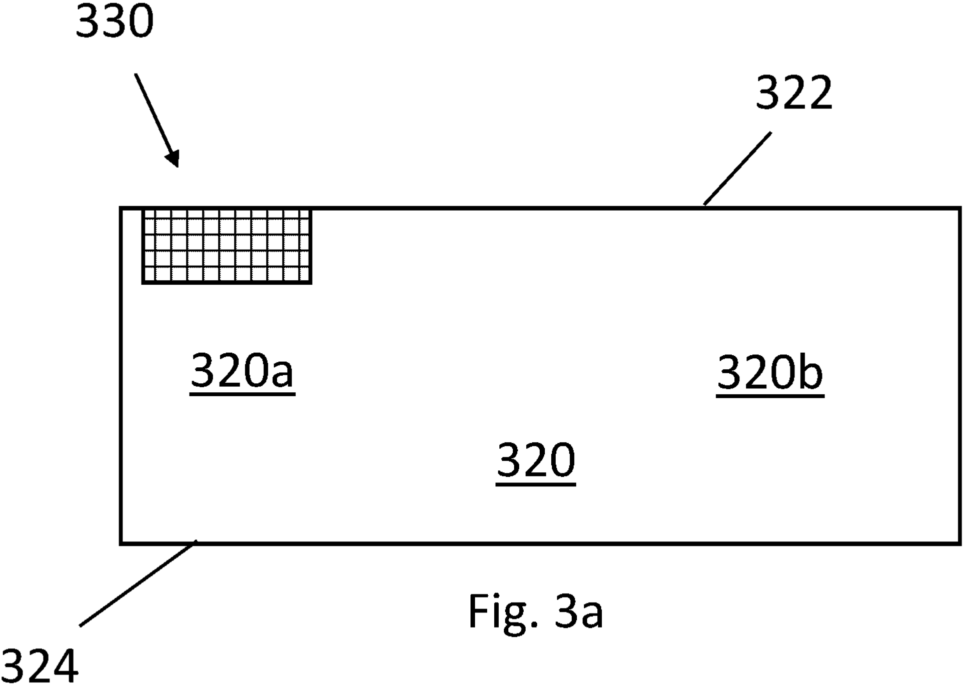
FIGS. 3*a* to 3*f* show stages of manufacture of a Micro-Electro-Mechanical Systems device in accordance with an aspect of the present disclosure.

FIG. 3*a* shows the provision of a substrate 320 in the form of a silicon wafer substrate 320, having a first surface 322 and a second surface 324, provided opposite the first surface 322. An integrated circuit substrate region 330 in the form of a CMOS substrate region 330 is provided at the substrate 320, in this example extending into the substrate 320 from the first surface 322 at a CMOS region 320*a* of the substrate 320. The CMOS substrate region 330 is typically formed on the substrate by way of standard CMOS fabrication methods. For example, integrated CMOS substrate regions may be deposited by way of one or more of the following methods: physical vapour deposition, chemical vapour deposition, electrochemical deposition, molecular beam epitaxy, atomic layer deposition, ion implantation, photopatterning, reactive ion etching, plasma exposure. The CMOS region 320*a* is distinct from a component region 320*b* of the substrate, as will be described further with reference to FIGS. 3*c* to 3*f* hereinafter.

Figure 3B:
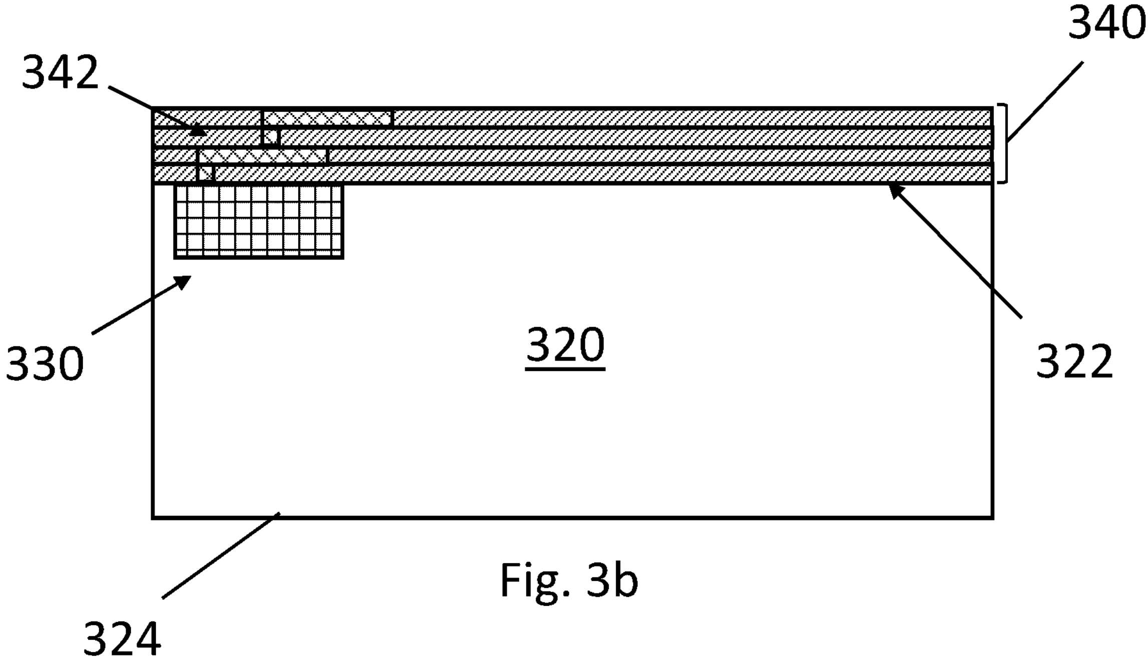
Figure 3C:
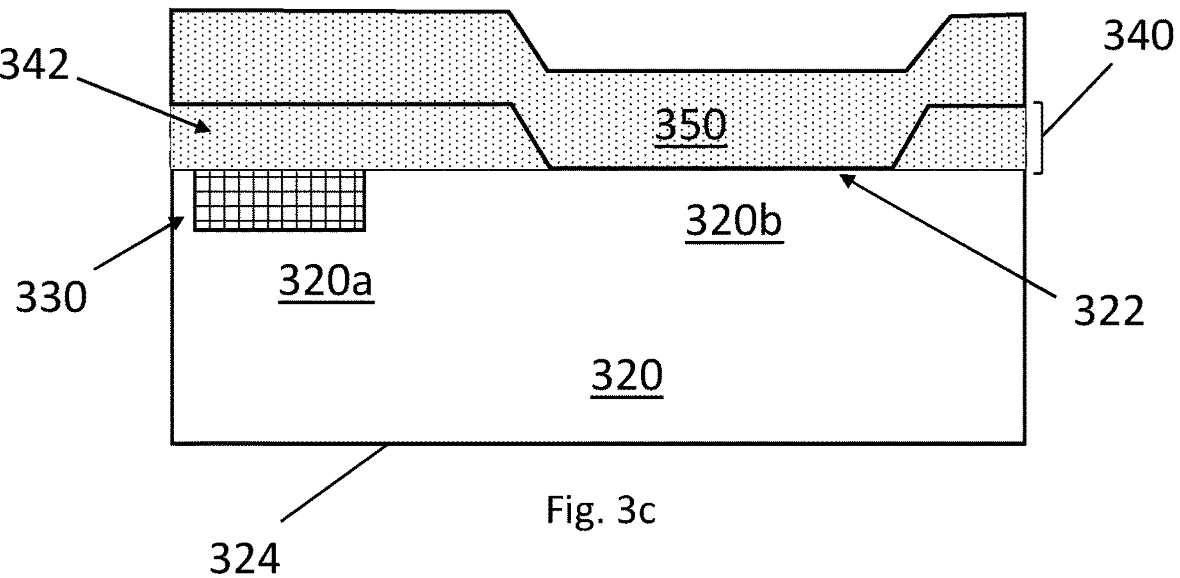
Figure 3D:
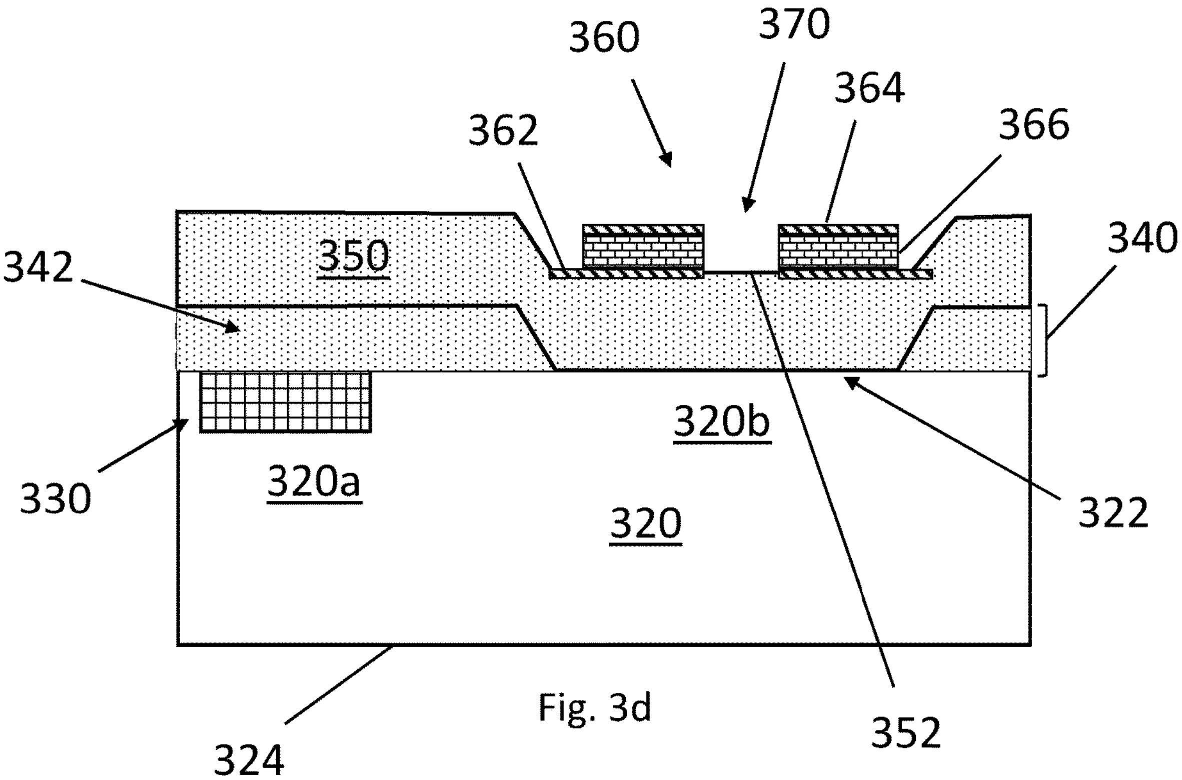

Subsequently, as shown in FIG. 3*b*, a plurality of CMOS passivation and metallisation layers 340 are formed onto the first surface 322 of the substrate 320, overlaying the CMOS substrate region 330, to provide electrical stability and chemical isolation from the environment to the CMOS substrate region 330, and also to provide electrical connections to and/or from the CMOS substrate region 330 via metallisation interconnects 342. The metallisation interconnects 342 are formed from aluminium. In other examples, the metallisation interconnects 342 can be formed from other electrical conductors, such as copper, aluminium copper alloys, or other alloying elements. In this example, the metallisation interconnects 342 provide a CMOS metallisation structure in the plurality of CMOS passivation and metallisation layers 340. The CMOS substrate region 330 and the plurality of CMOS passivation and metallisation layers 340 together form the CMOS circuit.

The plurality of CMOS passivation and metallisation layers 340 are formed using any suitable process known to the skilled person, such as by deposition and/or micro machining.

In this way, the plurality of CMOS passivation and metallisation layers 340 together form one or more CMOS metallisation features within the plurality of CMOS circuit layers, surrounded by a CMOS passivation region.

Next, a portion of the plurality of CMOS passivation and metallisation layers 340 are removed, away from the CMOS region 320*a* of the substrate 320, in the component region 320*b* of the substrate 320. In this way, the materials or structures used for the plurality of CMOS passivation and metallisation layers 340 can be not used in association with the component region 320*b*.

The plurality of CMOS passivation and metallisation layers 340 are removed in the component region 320*b* by etching, specifically deep reactive-ion etching (DRIE) or conventional CMOS passivation removal methods in the present example, without removal of the plurality of CMOS passivation and metallisation layers 340 in the CMOS region 320*a*. In this step, none or substantially none of the substrate 320 is removed. A wall surface of the plurality of CMOS passivation and metallisation layers 340 makes an angle of less than 90 degrees to the first surface 322 of the substrate 320, such that the angle between the wall surface and the outermost surface of the plurality of CMOS passivation and metallisation layers 340 is obtuse, but it will be understood that the angle can be up to 90 degrees in other examples. In this example, all of the plurality of CMOS passivation and metallisation layers 340 are removed in the component region 320*b*, but it will be understood that only some of the plurality of CMOS passivation and metallisation layers 340 may be removed in the component region 320*b* in other examples.

Following removal of the plurality of CMOS passivation and metallisation layers 340 in the component region 320*b*, a further passivation layer 350 is deposited over the assembly, specifically over the remaining portion of the plurality of CMOS passivation and metallisation layers 340 outside the component region 320*b* and over the first surface 322 of the substrate 320 in the component region 320*b*. In this way, the first surface 322 of the substrate 320 has deposited thereon the plurality of CMOS passivation and metallisation layers 340 in the CMOS region 320*a* and has deposited thereon the further passivation layer 350 in the component region 320*b*. The further passivation layer 350 is sometimes referred to as a MEMS passivation layer 350. In this example, the further passivation layer 350 is deposited to have a uniform thickness in a direction normal to the first surface 322 of the substrate 320. In other words, a thickness of the further passivation layer 350 in the CMOS region 320*a* is substantially the same as a thickness of the further passivation layer in the 11 component region 320*b*. The further passivation layer 350 is formed from a material different to any of the plurality of CMOS passivation and metallisation layers 340. Specifically, the further passivation layer 350 is formed from a material chosen based on structural and functional requirements of the MEMS component to be provided in the component region 320*b* of the MEMS device to be formed. The further passivation layer 350 provides protection, such as electrical and chemical stability to the components of the CMOS substrate region 330, and the plurality of CMOS passivation and metallisation layers 340.

The further passivation layer 350 typically has a thickness of between 1.0 micrometres to 10 micrometres. In this example, the thickness of the further passivation layer 350 is approximately 2 micrometres. Additionally, the further passivation layer 350 typically has a very low Young's modulus and therefore doesn't substantially affect the operation of the actuator (to be described subsequently).

Next, the Micro-Electro-Mechanical Systems (MEMS) component 360 in the form of a piezoelectric actuator 360 is deposited on an outer surface 352 of the further passivation layer 350. In this example, the piezoelectric actuator 360 is formed from a plurality of layers, each deposited separately. The piezoelectric actuator 360 comprises a first electrode 362 and a second electrode 364 and a piezoelectric body 366 provided between the first electrode 362 and the second electrode 364. The piezoelectric body 366 is configured to exhibit piezoelectric behavior when the MEMS device is fully assembled, though it will be understood that this may be applied to the piezoelectric body 366 after initial deposition of the piezoelectric actuator 360 onto the further passivation layer 350.

It will be understood that the piezoelectric actuator 360 and the further passivation layer 350 must each be formed from materials which can be deposited and for which processing to form the MEMS device is possible at environmental conditions, such as temperatures, at which damage to the CMOS substrate region 330 can be reduced or even completely avoided. A suitable such temperature is less than 450 degrees Celsius. A suitable material for the piezoelectric body 366 is aluminium nitride (AlN).

The piezoelectric actuator 360 is provided with an opening 370 defined therein, the purpose of which will be described further hereinafter with reference to FIG. 3*f*.

Figure 3E:
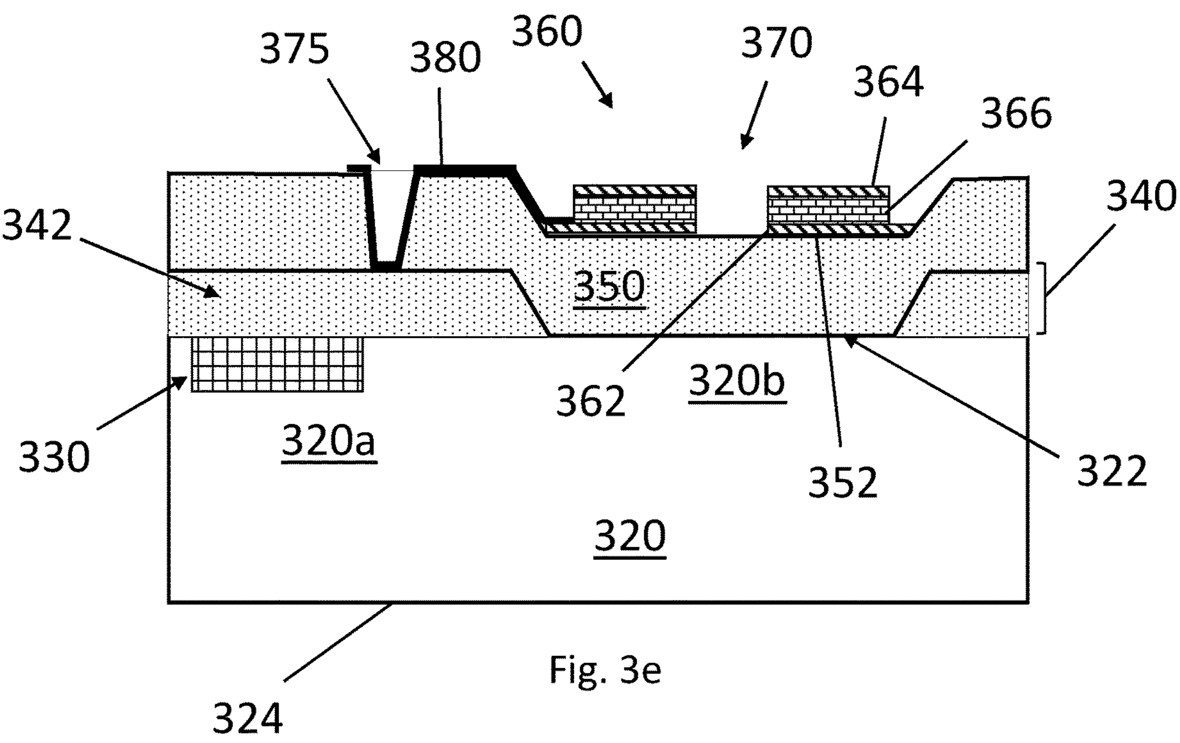

As shown in FIG. 3*e*, a portion of the further passivation layer 350 is removed, in this example by etching, adjacent to the metallisation interconnects 342 in the plurality of CMOS passivation and metallisation layers 340 in the CMOS region 320*a*, in particular to expose contact with the metallisation interconnects 342 otherwise adjacent to the further passivation layer 350. The etching is typically a DRIE process or a CMOS passivation etch process. In this way, a depression 375 is defined through the further passivation layer 350. Subsequently, a MEMS metallisation interconnect 380 is deposited on the further passivation layer 350 between the metallisation interconnects 342 exposed at an inner end of the depression 375 and at least one of the electrodes 362, 364 of the piezoelectric actuator 360, in this example the first electrode 362. In this way, it will be understood that control signals from the CMOS substrate region 330 can be provided to the piezoelectric actuator 360 via the metallisation interconnects 342, the MEMS metallisation interconnect 380 and the first electrode 362.

The MEMS metallisation interconnect 380 is typically formed from aluminium. In other examples, the MEMS metallisation interconnects 380 are formed from a different electrical conductor material, such as copper, an aluminium copper alloy, or another alloy.

Figure 3F:
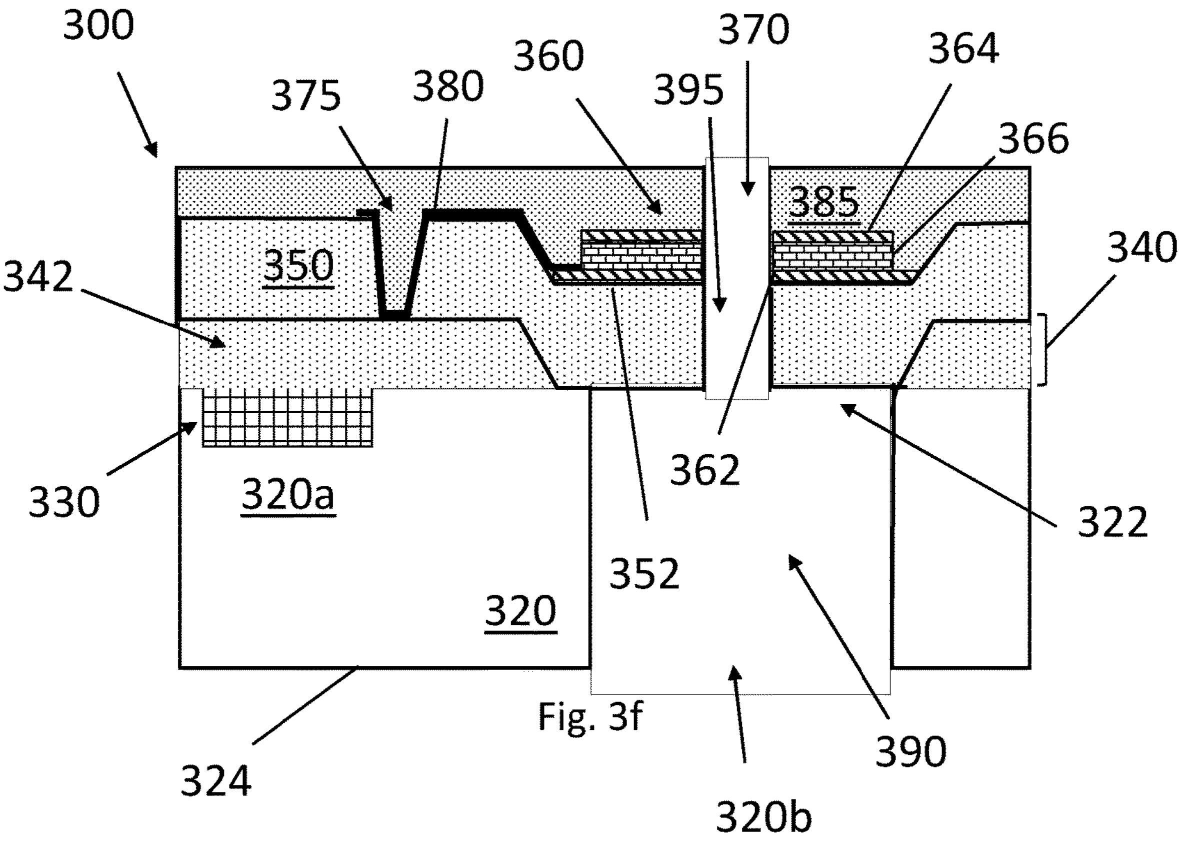

Next, as illustrated in FIG. 3*f*, further steps are completed to provide a MEMS device 300 in the form of a droplet ejector 300. The further steps include a further deposition of an encapsulation layer 385 covering the MEMS device 360 in the form of the piezoelectric actuator 360, the MEMS metallisation interconnect 380 and the further passivation layer 350. The further steps also include further removal steps.

The further removal steps in this example are performed to define structural features of the droplet ejector. Specifically, a nozzle structure 395 is defined by removal of material of the further passivation layer 350 in the component region 320*b*. The nozzle structure 395 is arranged to be defined within the opening 370 defined in the piezoelectric actuator 360 and to have a width smaller than a width of a fluid chamber 390 (as described hereinafter).

Furthermore, the substrate 320 is removed in the component region 320*b* to define at least a region of a fluid chamber 390. The fluid chamber 390 is formed by etching the substrate from the second surface 324 to the first surface 322, with the etch stopping at the interface between the substrate and the further passivation layer 350 (or the nozzle structure 395). The etching is typically a DRIE process. Thus, a MEMS device 300 is formed.

One or more droplets of fluid provided in the fluid chamber 390 can be controlled to be expelled via the nozzle 395 by activation of the piezoelectric actuator 360, controlled by the CMOS substrate region 330, as will be understood by the skilled person. Of course, control signals from further control circuitry can be provided to the CMOS substrate region 330 via further electrical connections (not shown). In this example, the fluid chamber 390 is completely filled with fluid in order to operate correctly.

It will be understood that the materials for forming the further passivation layer 350 are chosen to be fluid repellent to ensure fluid is contained within the chamber 390, and also to ensure consistent droplet directionality. The material of the further passivation layer 350 is typically planarizing to provide an optimum surface for printhead maintenance.

FIGS. 4 to 8 show further examples of Micro-Electro-Mechanical Systems devices in accordance with aspects of the present disclosure. Unless otherwise described, it will be understood that the features of the embodiments of the MEMS devices shown in FIGS. 4 to 8 should be understood to be substantially the same as in relation to FIGS. 3*a* to 3*e*, apart from the hereinafter noted distinctions.

Figure 4:
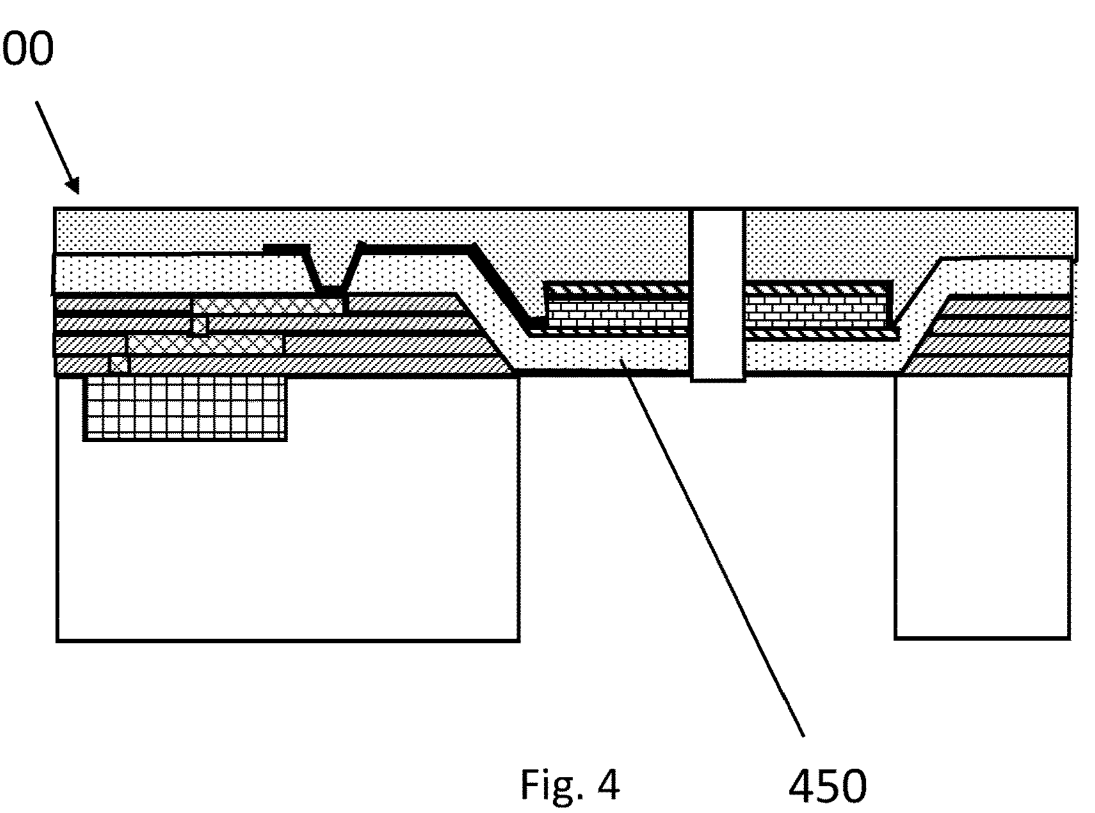
FIGS. 4 to 8 show further examples of Micro-Electro-Mechanical Systems devices in accordance with aspects of the present disclosure.

FIG. 4 shows a droplet ejector 400 wherein the further passivation layer 450 is formed to have a thickness less than that shown in FIGS. 3*a* to 3*e*.

Figure 5:
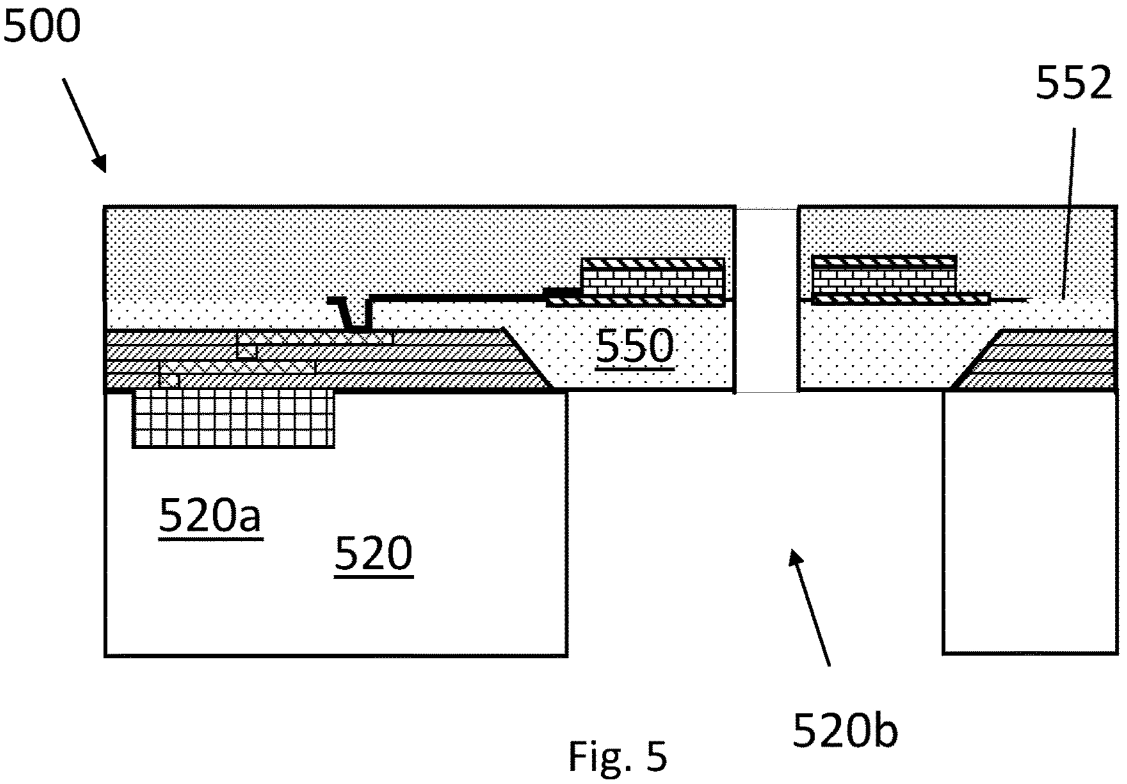

FIG. 5 shows a droplet ejector 500 wherein the further passivation layer 550 is formed such that a first surface 552 of the further passivation layer 550, opposite the substrate 520 is at a same perpendicular distance from the substrate 520 in both the CMOS region 520*a* and the component region 520*b*. In other words, a thickness of the further passivation layer 550 in the CMOS region 520*a* is less than a thickness of the further passivation layer 550 in the component region. In this way, a connection length through the MEMS passivation layer 550 in the CMOS region 520*a* can be shorter than were the thickness of the MEMS passivation layer 550 in the CMOS 8 region 520*a* to be the same as in the component region 520*b*. Thus, electrical connectivity is improved. Furthermore, by ensuring a planar first surface 552 of the further passivation layer 550, maintenance system requirements of printhead wiping and capping are also improved.

Figure 6:
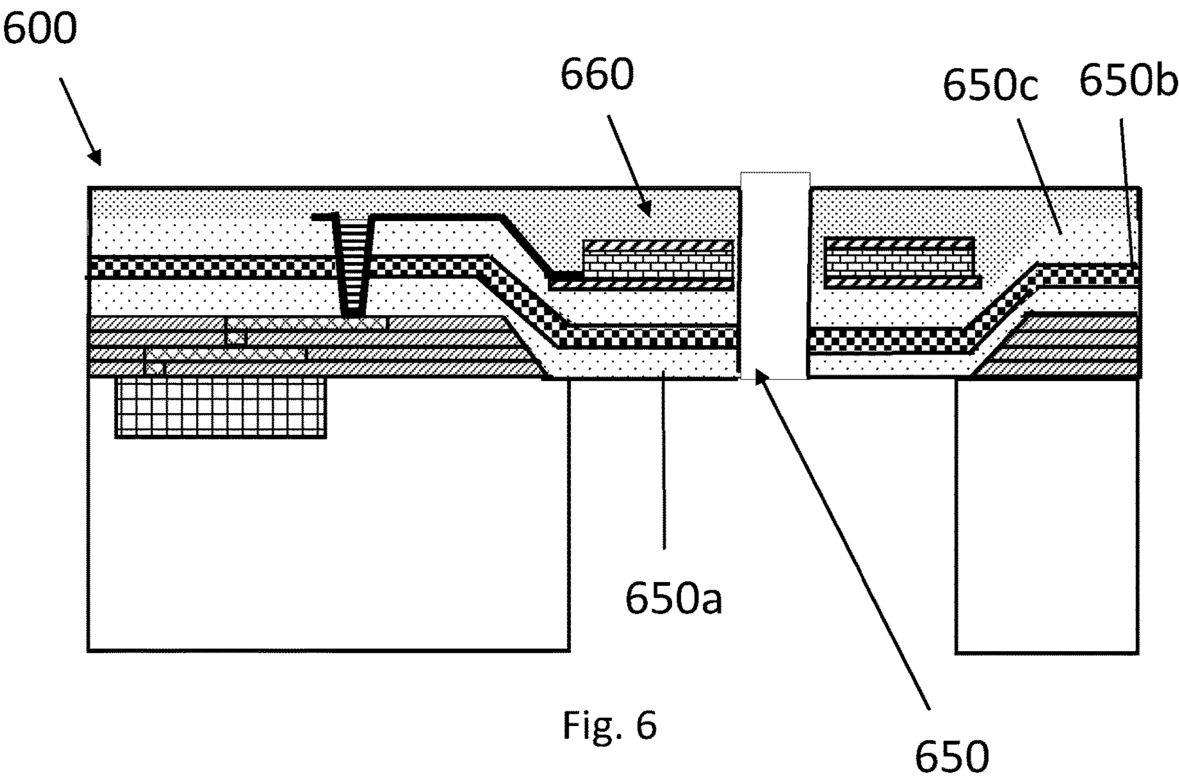

FIG. 6 shows a droplet ejector 600 wherein the further passivation layer 650 is a plurality of layers 650*a*, 650*b*, 650*c*. Each of the plurality of layers is typically chosen to provide a desired structural function for the MEMS component in the form of the piezoelectric actuator 660.

Figure 7:
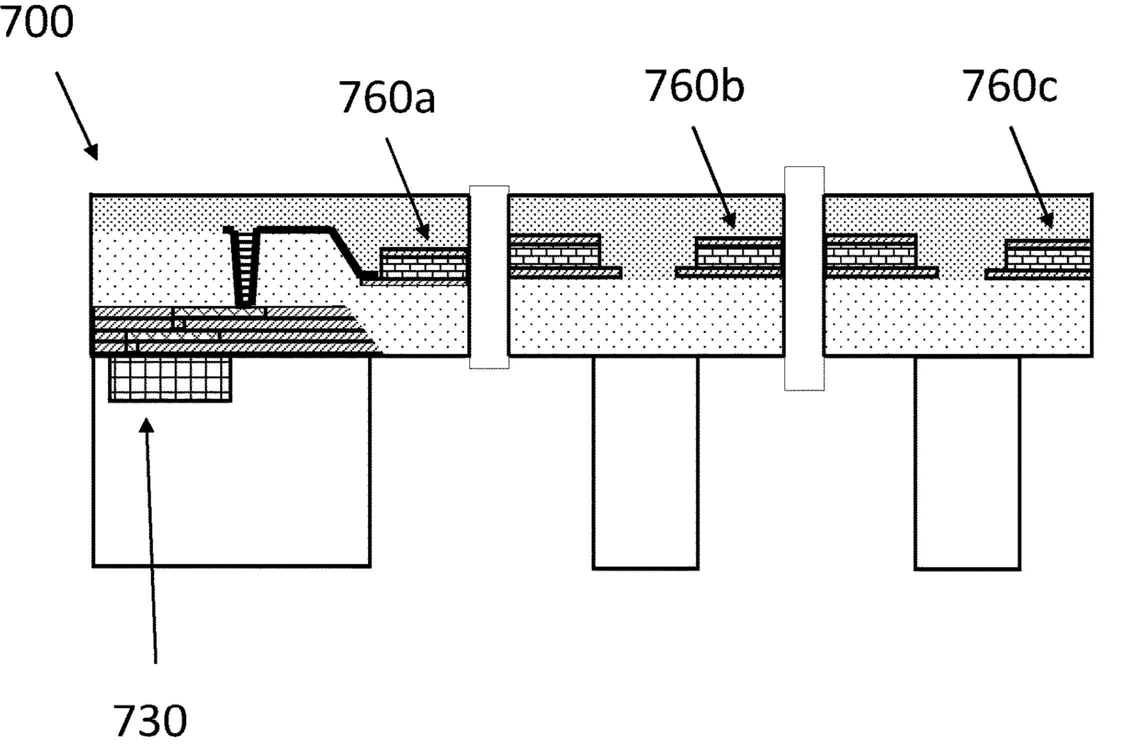

FIG. 7 shows a droplet ejector 700 wherein the droplet ejector comprises a plurality of MEMS components 760*a*, 760*b*, 760*c*, in the form of a plurality of piezoelectric actuators 760*a*, 760*b*, 760*c*. The first piezoelectric actuator 760*a* is electrically connected to the CMOS substrate region 730. Each piezoelectric actuator 760*a*, 760*b*, 760*c* is provided with a nozzle. Although not shown, it will be understood that typically each piezoelectric actuator 760*a*, 760*b*, 760*c* is electrically connected to the CMOS substrate region 730 such that the CMOS substrate region 730 can be used to control each of the piezoelectric actuators 760*a*, 760*b*, 760*c*.

Figure 8:
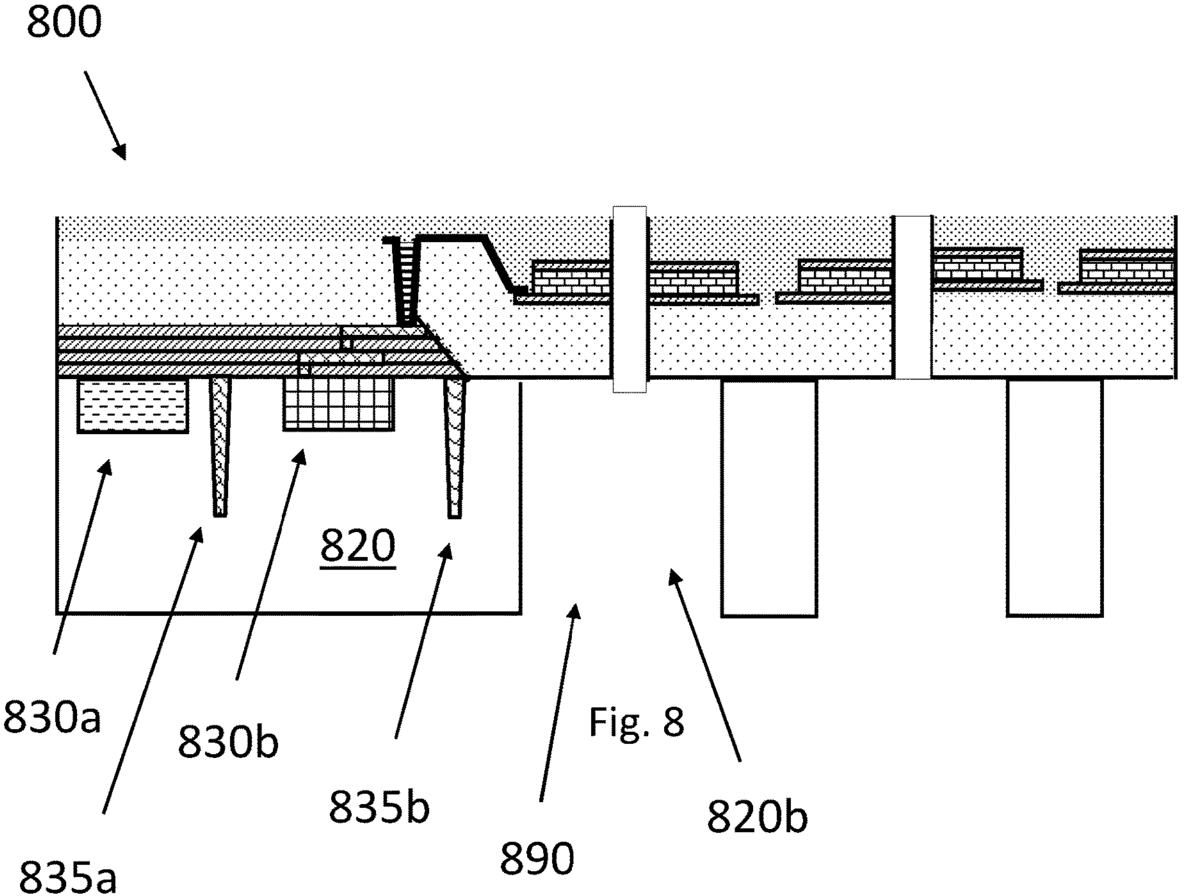

FIG. 8 shows a droplet ejector 800 similar to the droplet ejector shown in FIG. 7, though including a plurality of CMOS substrate regions 830*a*, 830*b*. In this example, the first CMOS substrate region 830*a* is a low voltage CMOS substrate region 830*a* and the second CMOS substrate region 830*b* is a high voltage CMOS substrate region 830*b*. The low voltage CMOS substrate region 830*a* is separated (i.e., electrically isolated, such as electrically stabilised) from the high voltage CMOS substrate region 830*b* by a deep trench isolation (DTI) feature 835*a*. A further DTI feature 835*b* is provided between the high voltage CMOS substrate region 830*b* and the fluid chamber 890 defined in the component region 820*b* of the substrate 820. It will be understood that the representation of the MEMS device shown in the present Figures is shown for schematic illustration only and is not intended to be considered to be to scale or proportion.

Figure 9:
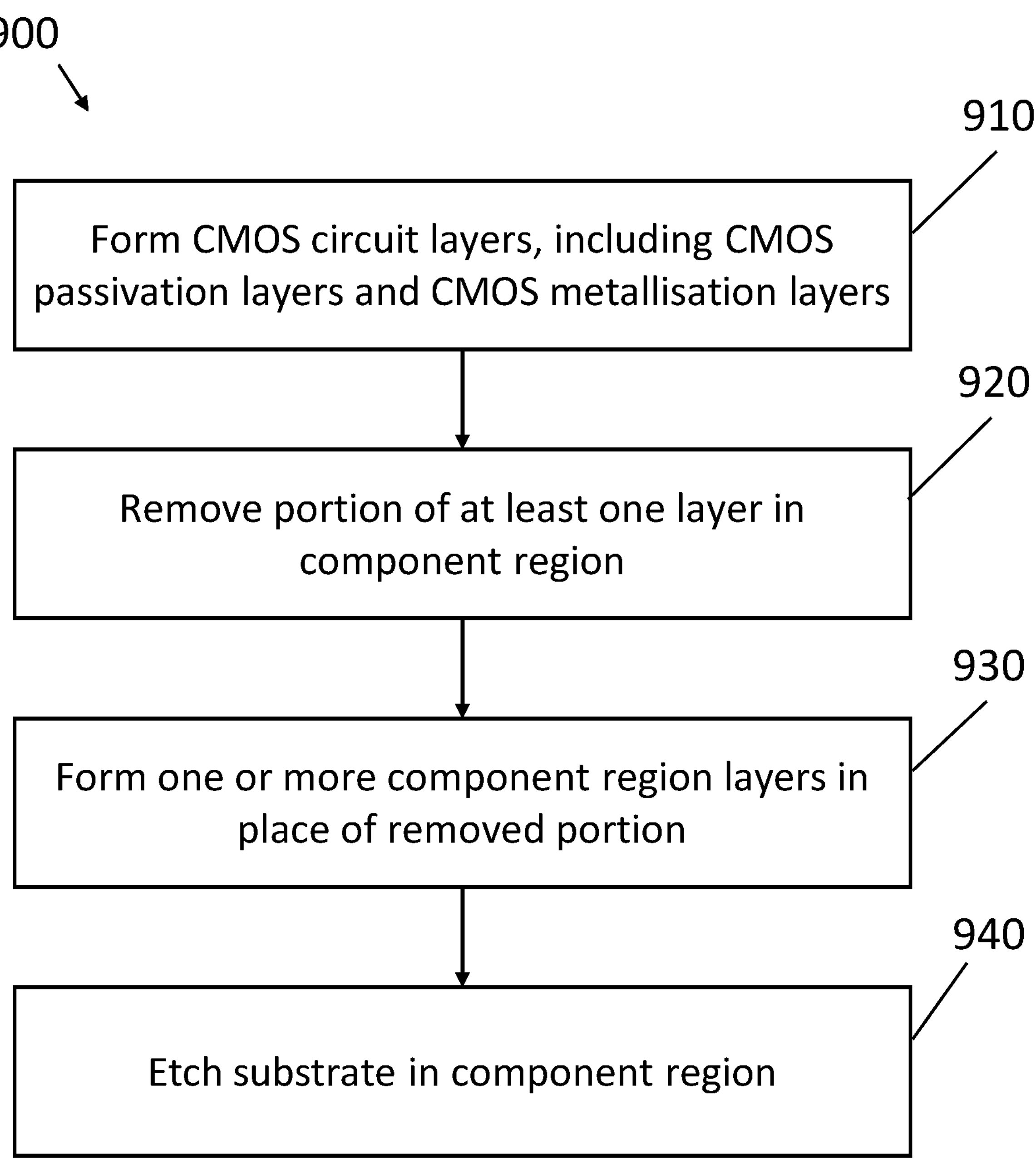
FIG. 9 is a flowchart illustrating a method of forming a Micro-Electro-Mechanical Systems device in accordance with aspects of the present disclosure.

FIG. 9 is a flowchart illustrating a method of forming a Micro-Electro-Mechanical Systems device in accordance with aspects of the present disclosure. The method 900 is substantially similar to that described with reference to FIGS. 3*a* to 3*f* described hereinbefore. Briefly, the method 900 is a method of forming a MEMS device by replacing one or more CMOS passivation layers and/or CMOS metallisation layers in a component region of the MEMS device with a MEMS layer. In this way, the MEMS component can be formed from materials different to those chosen for their utility as CMOS passivation layers and/or CMOS metallisation layers.

Specifically, the method 900 is a method of manufacturing a MEMS device comprising a movable Micro-Electro-Mechanical component and a CMOS circuit configured to be in conductive communication with the Micro-Electro-Mechanical component. The method 900 comprises forming 910 a CMOS circuit, including a plurality of CMOS passivation layers and a plurality of CMOS metallisation layers. Typically, the CMOS circuit is formed to comprise a plurality of transistors configured such that the CMOS circuit forms as a controller. Electrical signals can be exchanged with the CMOS circuit via the plurality of CMOS metallisation layers.

Subsequent to formation 910 of the CMOS circuit, the method 900 comprises removing 920 a portion of at least one of the plurality of CMOS passivation layers and/or the plurality of CMOS metallisation layers in a component region of the device. As described hereinbefore, the portion is typically removed by an etching process, such as a DRIE process.

After removal 920 of the portion, the method 900 comprises forming 930 one or more component region layers in place of the removed portion. The one or more component region layers are formed in the component region and form the movable Micro-Electro-Mechanical component. Significantly, by forming at least one of the one or more component region layers from a material different from the removed portion, the resulting MEMS device can have structural features in the MEMS component which are chosen specifically to support the functionality of the MEMS component.

The method 900 optionally further comprises etching (940) the substrate in the component region to define a substrate opening therein. Typically, the substrate opening is configured to extend within the substrate to a boundary between the substrate and the one or more component region layers in the component region. In some examples, the etching step is configured to proceed through the substrate and to stop at the boundary between the substrate and the one or more component region layers in the component region. In this way, the one or more component region layers in the component region can be released from the substrate, improving their ability to flex.

In summary, there is provided a method (900) of manufacturing a Micro-Electro-Mechanical Systems, MEMS, device. The MEMS device comprises a movable Micro-Electro-Mechanical component (360) and a CMOS circuit (330, 340, 342) configured to be in conductive communication with the Micro-Electro-Mechanical component. The method comprises; forming (910) a plurality of CMOS circuit layers (330, 340, 342), the one or more CMOS circuit layers comprises a plurality of CMOS passivation layers and a plurality of CMOS metallisation layers (340); removing (920) a portion of at least one of the plurality of CMOS passivation layers and/or the plurality of CMOS metallisation layers (340) in a component region (320*b*) of the device; and forming (930) one or more component region layers (350, 352, 364, 366) in the component region to form the movable Micro-Electro-Mechanical component (360). The one or more component region layers are formed from a material different from the portion of the at least one of the one or more CMOS circuit layers.

Throughout the description and claims of this specification, the words “comprise” and “contain” and variations of them mean “including but not limited to”, and they are not intended to and do not exclude other components, integers or steps. Throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics or groups described in conjunction with a particular aspect, embodiment or example of the invention are to be understood to be applicable to any other aspect, embodiment or example described herein unless incompatible therewith. All of the features disclosed in this specification including any accompanying claims, abstract and drawings), and/or all of the steps of any method or process so disclosed, may be combined in any combination, except combinations where at least some of such features and/or steps are mutually exclusive. The invention is not restricted to the details of any foregoing embodiments. The invention extends to any novel one, or any novel combination, of the features disclosed in this specification including any accompanying claims, abstract and drawings), or to any novel one, or any novel combination, of the steps of any method or process so disclosed.

The invention claimed is:

1. A method of manufacturing a Micro-Electro-Mechanical Systems, MEMS device, the MEMS device comprising a movable Micro-Electro-Mechanical piezoelectric component and a CMOS circuit configured to be in conductive communication with the Micro-Electro-Mechanical component, the method comprising:

forming a plurality of CMOS circuit layers on a substrate to form the CMOS circuit, the plurality of CMOS circuit layers comprising a plurality of CMOS passivation and metallisation layers;

removing a portion of at least one of the plurality of CMOS passivation and metallisation layers in a component region of the device; and forming one or more component region layers in place of the removed portion in the component region to form the movable Micro-Electro-Mechanical piezoelectric component, the one or more component region layers different from the portion of the at least one of the plurality of CMOS passivation and metallisation layers, wherein a one of the one or more component region layers is a MEMS passive layer, and wherein forming the one or more component region layers comprises depositing the Micro-Electro-Mechanical component on the MEMS passive layer.

2. The method of claim 1, wherein removing the portion of the at least one of the plurality of CMOS passivation and metallisation layers comprises removing the portion of each of the plurality of CMOS passivation and metallisation layers in the component region of the device.

3. The method of claim 1, wherein removing the portion of the at least one of the plurality of CMOS passivation and metallisation layers comprises etching the layers to be removed.

4. The method of claim 1, wherein at least one of the one or more component region layers is formed from a material different from an adjacent layer among the plurality of CMOS circuit layers, the adjacent layer level with the at least one of the one or more component region layers.

5. The method of claim 1, wherein forming the one or more component region layers comprises depositing a MEMS passive layer in place of the removed portion.

6. The method of claim 1, wherein a one of the plurality of CMOS passivation and metallisation layers is formed on a first surface of the substrate, and wherein in the component region, the one or more component region layers extend to be planar with the first surface.

7. A method of manufacturing a Micro-Electro-Mechanical Systems, MEMS device, the MEMS device comprising a movable Micro-Electro-Mechanical piezoelectric component and a CMOS circuit configured to be in conductive communication with the Micro-Electro-Mechanical component, the method comprising:

forming a plurality of CMOS circuit layers on a substrate to form the CMOS circuit, the plurality of CMOS circuit layers comprising a plurality of CMOS passivation and metallisation layers;

removing a portion of at least one of the plurality of CMOS passivation and metallisation layers in a component region of the device; and forming one or more component region layers in place of the removed portion in the component region to form the movable Micro-Electro-Mechanical piezoelectric component, the one or more component region layers different from the portion of the at least one of the plurality of CMOS circuit layers, wherein forming the one or more component region layers comprises depositing a MEMS passive layer in place of the removed portion, and wherein the MEMS passive layer overlays the plurality of CMOS passivation and metallisation layers in the CMOS circuit region.

8. A Micro-Electro-Mechanical Systems, a MEMS device comprising:

a substrate having a CMOS circuit integrally provided therewith, the CMOS circuit being formed by a plurality of CMOS circuit layers including a plurality of CMOS passivation and metallisation layers, and arranged in a CMOS circuit region of the MEMS device; and a movable Micro-Electro-Mechanical piezoelectric component configured to be controlled by the CMOS circuit and arranged in a component region of the MEMS device, the component region distinct from the CMOS circuit region, wherein the component region comprises one or more component region layers including the Micro-Electro-Mechanical piezoelectric component, wherein the or each of the one or more component region layers in the component region is different from each of the plurality of CMOS passivation and metallisation layers, of the CMOS circuit region, wherein a one of the one or more component region layers is a MEMS passive layer, wherein the MEMS passive layer overlays the plurality of CMOS passivation and metallisation layers in the CMOS circuit region, wherein the Micro-Electro-Mechanical component is deposited on the MEMS passive layer, wherein a one of the plurality of CMOS passivation and metallisation layers is formed on a first surface of the substrate, and wherein in the component region, the one or more component region layers extend to be planar with the first surface.

9. The MEMS device of claim 8, wherein the Micro-Electro-Mechanical component is a plurality of Micro-Electro-Mechanical components, each defining a respective nozzle opening in the component region.

10. The MEMS device of claim 9, wherein each of the Micro-Electro-Mechanical components is electrically connected to and to be controlled by the CMOS circuit.

11. The MEMS device of claim 8, wherein the substrate defines an opening in the component region and the Micro-Electro-Mechanical component comprises a cantilever or a diaphragm extending over the opening.

12. The MEMS device of claim 11, wherein the Micro-Electro-Mechanical component is an actuator.

13. The EMS device of claim 12, wherein the actuator is a piezoelectric actuator.

14. The MEMS device of claim 12, wherein the MEMS device is a droplet ejector for a printhead.

15. The MEMS device of claim 8, wherein the one or more component region layers are a plurality of different component region layers.

16. The MEMS device of claim 8, wherein the Micro-Electro-Mechanical component is a sensor component.

17. A printhead comprising the MEMS device of claim 8, wherein the MEMS device is a droplet ejector for the printhead.

18. A printer comprising the printhead of claim 17, wherein the printer is configured to control operation of the actuator of at least one droplet ejector to cause ejection of printing liquid from the droplet ejector.

19. The printer of claim 18, further comprising the source of printing liquid.

20. A method of printing, the method comprising:

providing print apparatus including a printer as claimed in claim 18; and controlling at least one of the one or more droplet ejectors such that the actuator is caused to flex at least one of the one or more component region layers, whereby to eject printing liquid from the droplet ejector to print using the printing liquid.

21. A Micro-Electro-Mechanical Systems, a MEMS device comprising:

a substrate having a CMOS circuit integrally provided therewith, the CMOS circuit being formed by a plurality of CMOS circuit layers including a plurality of CMOS passivation and metallisation layers, together extending between a first plane defined between a one of the plurality of CMOS passivation and metallisation layers bordering the substrate and the substrate, and a second plane defined parallel to the first plane and by a furthest one of the plurality of CMOS passivation and metallisation layers, and arranged in a CMOS circuit region of the MEMS device; and a movable Micro-Electro-Mechanical piezoelectric component configured to be controlled by the CMOS circuit and arranged in a component region of the MEMS device, the component region distinct from the CMOS circuit region, wherein the component region comprises one or more component region layers including the Micro-Electro-Mechanical piezoelectric component, at least one of the one or more component region layers extending to the first plane in a direction from the second plane to the first plane, and wherein the at least one of the one or more component region layers extending to the first plane is formed from a material different from the one of the plurality of CMOS passivation and metallisation layers bordering the substrate, wherein a one of the one or more component region layers is a MEMS passive layer, and wherein the Micro-Electro-Mechanical component is deposited on the MEMS passive layer.

* * * * *